United States Patent [19]

Watts, Jr.

[11] Patent Number: 5,761,266

[45] Date of Patent: Jun. 2, 1998

[54] SHIFTER CIRCUIT THAT EMULATES A BARREL SHIFTER

[75] Inventor: Charles E. Watts, Jr., Fort Worth, Tex.

[73] Assignee: National Semiconductor Corporation, Santa Clara, Calif.

[21] Appl. No.: 755,548

[22] Filed: Nov. 22, 1996

[51] Int. Cl.$^6$ ................................................ G11C 19/00
[52] U.S. Cl. ................ 377/81; 377/69; 377/70; 377/75
[58] Field of Search ................ 377/69, 70, 75, 377/81

[56] References Cited

U.S. PATENT DOCUMENTS

| | | | |
|---|---|---|---|
| 5,295,174 | 3/1994 | Shimizu | 377/81 |
| 5,555,202 | 9/1996 | Chu | 377/70 |

OTHER PUBLICATIONS

IBM Tech Disc Bul, vol. 28, No. 7, Dec. 1985 "Barrel Sifter" pp. 2769–2772.

*Primary Examiner*—Margaret Rose Wambach
*Attorney, Agent, or Firm*—Limbach & Limbach L.L.P.

[57] ABSTRACT

A shifting circuit operates on a plurality of input sub-words, that collectively constitute an input data word, to generate a plurality of result sub-words that collectively represent the input data word, shifted. The shifting circuit receives, during each cycle, a separate one of the plurality of input sub-words. A combiner/selector performs a shift on each sub-word provided on the I-bus, taking carry-in bits from a carry-in register. Before a shifting operation is executed, the carry-in register is initialized to zero. (Alternately, the carry-in register may be reset to zero after a shifting operation is executed.) The carry-in register is also connected to receive the sub-words provided by the data source circuit onto the I-bus. Thus, in a system clock cycle when a particular sub-word on the I-bus is being shifted by the combiner/selector, the carry-in register is holding (and providing to the combiner/selector as a source of carry-in bits) the sub-word provided from the carry-in register is the sub-word that was on the I-bus during the previous system clock cycle (except that when the sub-word being shifted is the first sub-word being shifted, the bits of the sub-word provided from the carry-in register are all zero). The shifted sub-words are provided to an OUT-bus in sequence from the combiner/selector.

7 Claims, 7 Drawing Sheets

SHIFTER CIRCUIT THAT EMULATES A BARREL SHIFTER

TECHNICAL FIELD

The present invention relates to circuitry for performing a barrel shift and, in particular, to a circuit that emulates a barrel shift using fewer circuit elements than prior art barrel shifters.

BACKGROUND

Barrel shifters formed in integrated circuits are well-known in the art. Specifically, known barrel shifters concurrently shift an n-bit input word over by m (selectable) bits. However, where n is large, well-known barrel shifters require a large amount of integrated circuit die.

SUMMARY

The present invention is a circuit that emulates a barrel shifter. That is, whereas prior art barrel shifters typically concurrently shift all of the bits of an input word, the shifter circuit in accordance with the present invention sequentially shifts separate subwords of the input word. As such, while a shifting operation executed by the circuit in accordance with the present invention typically takes longer than a shifting operation executed by a prior art barrel shifter, the circuit in accordance with the present invention can be implemented in a smaller amount of integrated circuit die than can the prior art shifter circuits.

In particular, the circuit in accordance with the invention is a shifting circuit that operates on a plurality of input sub-words, that collectively constitute an input data word, to generate a plurality of result sub-words that collectively represent the input data word, shifted. The shifting circuit receives, during each cycle, a separate one of the plurality of input sub-words. During each cycle, a carry-in register latches the one input sub-word received during that cycle while providing the one input sub-word latched by the carry-in register during an immediately previous cycle. During each cycle, combining circuitry provides a result sub-word for that cycle responsive to both the one sub-word received by the receiving circuitry during that cycle and the one input sub-word provided by the carry-in register during that cycle.

These and other features and advantages of the present invention will be understood upon consideration of the following detailed description of the invention and the accompanying drawings.

DETAILED DESCRIPTION

Figure 1:
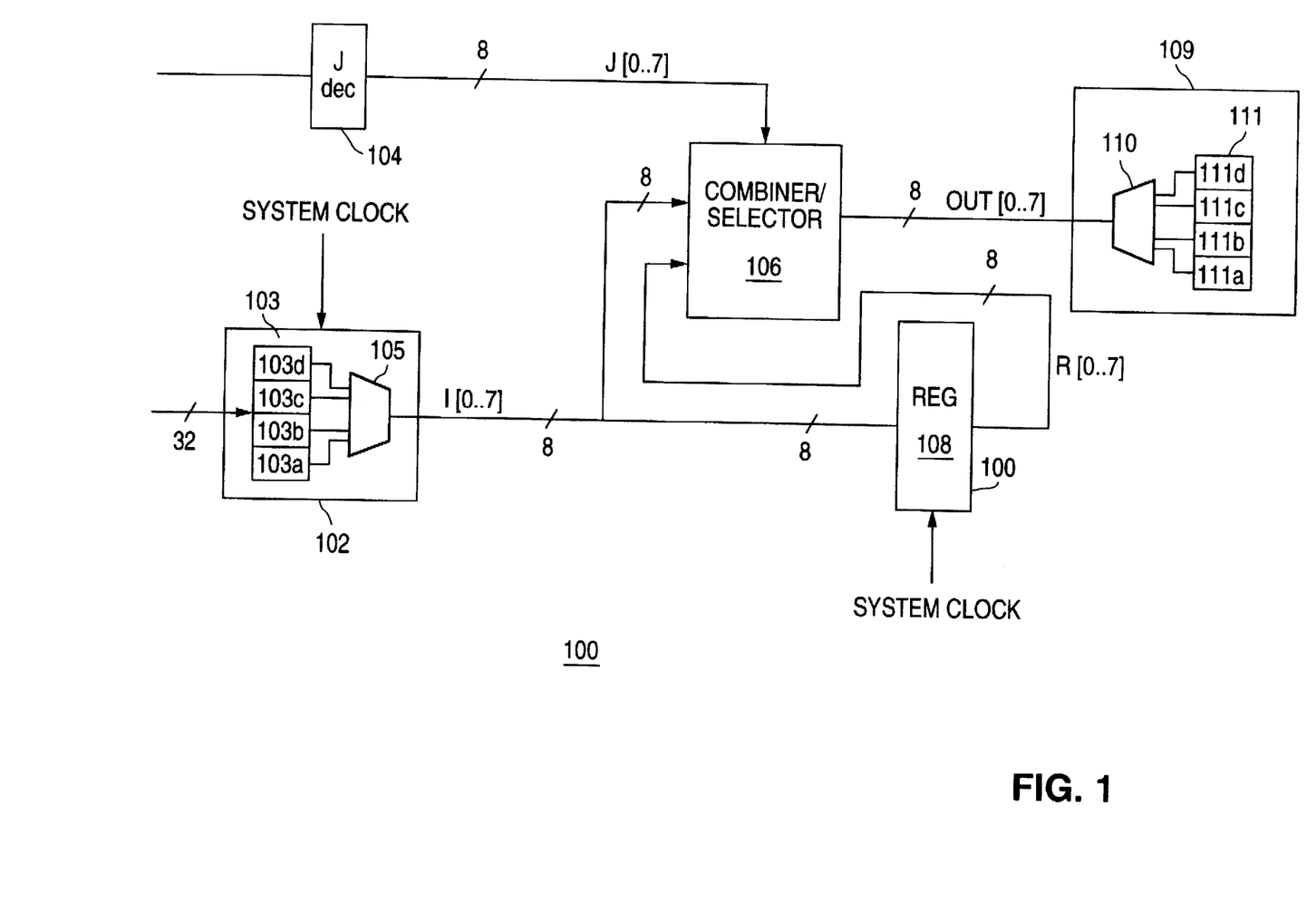
FIG. 1 schematically illustrates a shifter circuit 100, in accordance with an embodiment of the present invention, for shifting a digital word having a multiple "m" of 8 bits in "m" cycles of a system clock.

FIG. 1 schematically illustrates a shifter circuit 100 in accordance with an embodiment of the present invention for shifting a 32 bit word, held in a source register 103, by zero to seven bits and providing the shifted 32 bit word into a destination register 111. The number of bits by which the 32 bit word is to be shifted is indicated by one of eight lines of a J-bus being asserted. In particular, J[0] being asserted indicates that the 32 bit word is to be shifted by zero bits; J[1] being asserted indicates that the 32 bit word is to be shifted by one bit; and so on, up to J[7] being asserted indicating that the 32 bit word is to be shifted by seven bits. After four cycles of the system clock, the destination register will hold the shifted 32 bit value.

The data source circuit 102 includes a data source register 103, and the data source register 103 includes sub-registers 103a through 103d, each for holding sub-words of the 32 bit word to be shifted. Sub-register 103d holds the most significant sub-word of the 32 bit word and sub-register 103a holds the least significant sub-word of the 32 bit word. A data selector 105 of the data source circuit 102 provides the sub-words from the data source register 103 to an I-bus in sequence from the sub-registers 103a through 103d, respectively, for left shifts; and from the sub-registers 103d through 103a, respectively, for right shifts.

A combiner/selector 106 performs a shift on each sub-word provided on the I-bus, taking carry-in bits from a carry-in register 108. Before a shifting operation is executed, the carry-in register 108 is initialized to zero. (Alternately, the carry-in register 108 may be reset to zero after a shifting operation is executed.) The carry-in register 108 is also connected to receive the sub-words provided by the data source circuit 102 onto the I-bus. Thus, in a system clock cycle when a particular sub-word on the I-bus is being shifted by the combiner/selector 106, the carry-in register 108 is holding (and providing to the combiner/selector 106 as a source of carry-in bits) the sub-word provided from the carry-in register is the sub-word that was on the I-bus during the previous system clock cycle (except that when the sub-word being shifted is the first sub-word being shifted, the bits of the sub-word provided from the carry-in register are all zero).

The shifted sub-words are provided to an OUT-bus in sequence from the combiner/selector 106. The OUT-bus is connected to provide the shifted sub-words to a data destination register 111 of a data destination circuit 109. The data destination register 111 includes sub-registers 111a through 111d for holding sub-words of the shifted 32 bit word. Sub-register 111d holds the most significant sub-word of the shifted 32 bit word and sub-register 111a holds the least significant sub-word of the shifted 32 bit word. A data selector 110 of the data source circuit 109 provides the shifted sub-words from the OUT-bus in sequence to the sub-registers 111a through 111d, respectively, for left shifts; and from the sub-registers 111d through 111a, respectively, for right shifts.

Figure 2A:
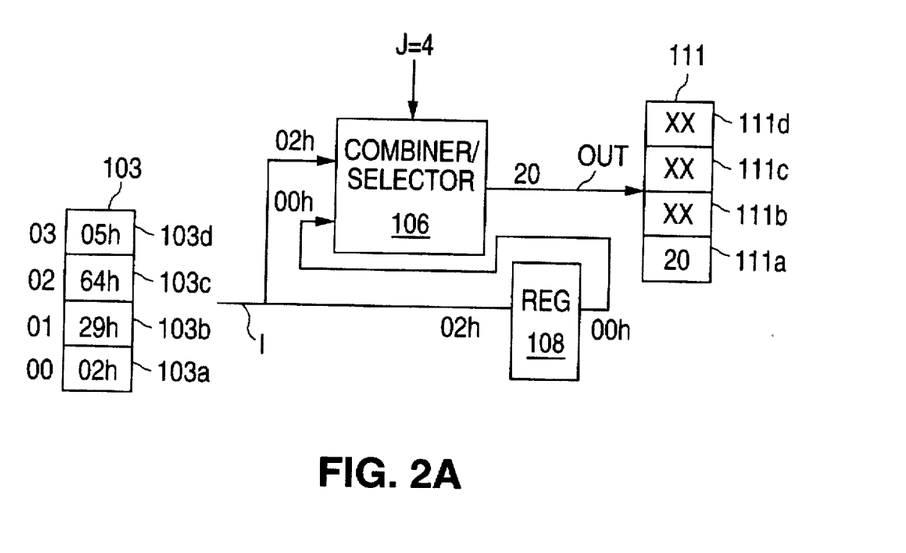
FIGS. 2A–2D illustrate how the circuit 100 of FIG. 1 performs an example left shift by four bits.

A four bit left shift example is now discussed with reference to FIGS. 2A through 2D. (That is, the J[4] line is asserted.) The 32-bit word to be shifted, 05642902h is held in data source register 103. Referring first to FIG. 2A, during the first system clock cycle of the left shift operation, the least significant sub-word (02h) is provided onto the I-bus from the source sub-register 103a. During the first system clock cycle of the left shift operation, the sub-word on the I-bus (02h) is both provided to the carry-in register 108 for latching and provided to the combiner/selector 106 for shifting.

Meanwhile, the sub-word previously latched into the carry-in register (in this case, the carry-in register 108 has been initialized or reset to zero) is also provided to the combiner/selector 106. The combiner/selector 106 provides the shifted sub-word (i.e., a result sub-word) onto the OUT bus. Specifically, the least significant four bits of the sub-word on the I-bus (2h) are provided by the combiner/selector 106 as the most significant four bits of the result sub-word. The most significant four bits provided from the carry-in register 108 (again, in this case, all having a value of zero) are provided by the combiner/selector 106 as the least significant four bits of the result sub-word.

Referring again to FIG. 2A, the result sub-word provided by the combiner/selector 106 in the first clock cycle of the shift operation is 20h—the 2h is the least significant four bits of the sub-word on the I-bus and the 0h is the most significant four bits of the sub-word provided from the carry-in register 108. The result sub-word provided by the combiner/selector 106 in the first system clock cycle of the shift operation is stored into result sub-register 111a.

Figure 2B:
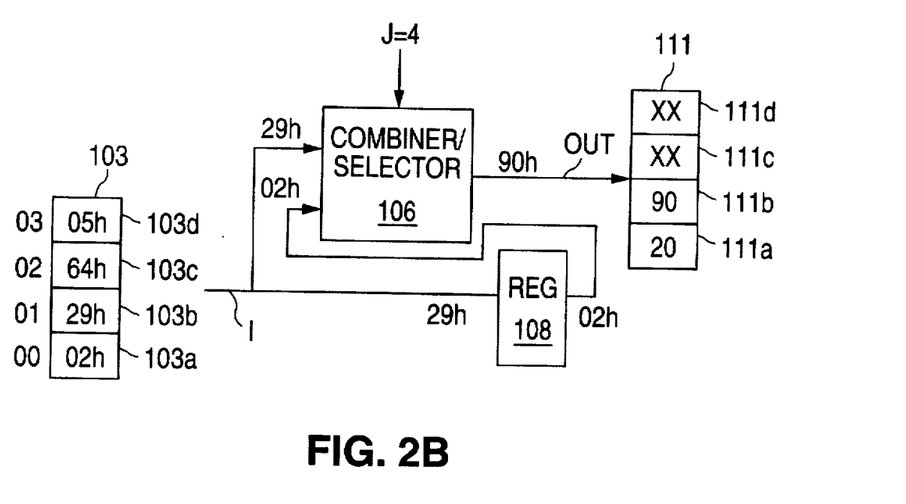

Referring next to FIG. 2B, during the second system clock cycle of the left shift operation, the next to least significant sub-word (29h) is provided onto the I-bus from the source sub-register 103b. During the second system clock cycle of the left shift operation, the sub-word on the I-bus (29h) is both provided to the carry-in register 108 for latching and provided to the combiner/selector 106 for shifting.

Meanwhile, the sub-word previously latched into the carry-in register (02h) is also provided to the combiner/selector 106. The combiner/selector 106 provides the shifted sub-word (i.e., the result sub-word) onto the OUT bus. Again, the least significant four bits of the sub-word on the I-bus (9h) are provided by the combiner/selector 106 as the most significant four bits of the result sub-word. The most significant four bits provided from the carry-in register 108 (0h) are provided by the combiner/selector 106 as the least significant four bits of the result sub-word.

Referring again to FIG. 2B, the result sub-word provided by the combiner/selector 106 in the second clock cycle of the shift operation is 90h—the 9h is the least significant four bits of the sub-word on the I-bus and the 0h is the most significant four bits of the sub-word provided from the carry-in register 108. The result sub-word provided by the combiner/selector 106 in the second system clock cycle of the shift operation is stored into result sub-register 111b.

Figure 2C:
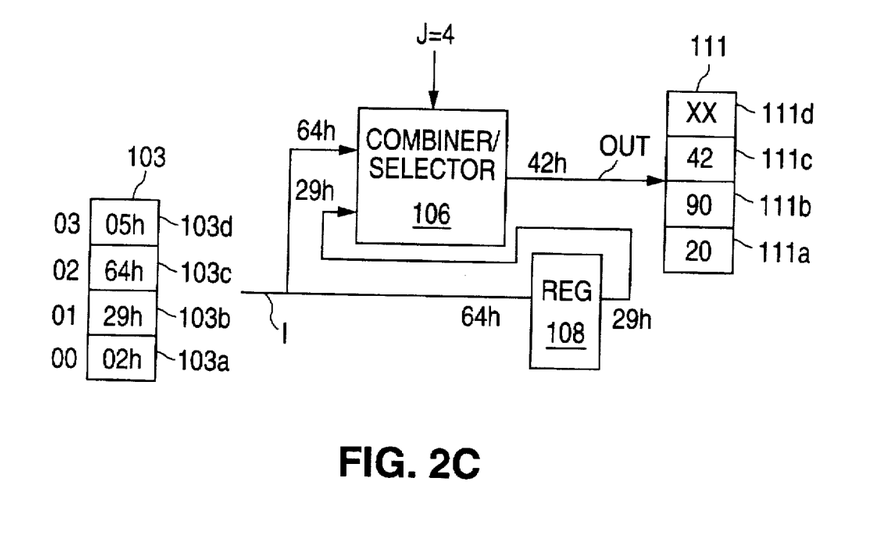

Referring next to FIG. 2C, during the third system clock cycle of the left shift operation, the least significant sub-word twice removed (64h) is provided onto the I-bus from the source sub-register 103c. During the third system clock cycle of the left shift operation, the sub-word on the I-bus is both provided to the carry-in register 108 for latching and provided to the combiner/selector 106 for shifting.

Meanwhile, the sub-word previously latched into the carry-in register (29h) is also provided to the combiner/selector 106. The combiner/selector 106 provides the shifted sub-word (i.e., the result sub-word) onto the OUT bus. Again, the least significant four bits of the sub-word on the I-bus (4h) are provided by the combiner/selector 106 as the most significant four bits of the result sub-word. The most significant four bits provided from the carry-in register 108 (2h) are provided by the combiner/selector 106 as the least significant four bits of the result sub-word.

Referring again to FIG. 2C, the result sub-word provided by the combiner/selector 106 in the third clock cycle of the shift operation is 42h—the 4h is the least significant four bits of the sub-word on the I-bus and the 2h is the most significant four bits of the sub-word provided from the carry-in register 108. The result sub-word provided by the combiner/selector 106 in the third system clock cycle of the shift operation is stored into result sub-register 111c.

Figure 2D:
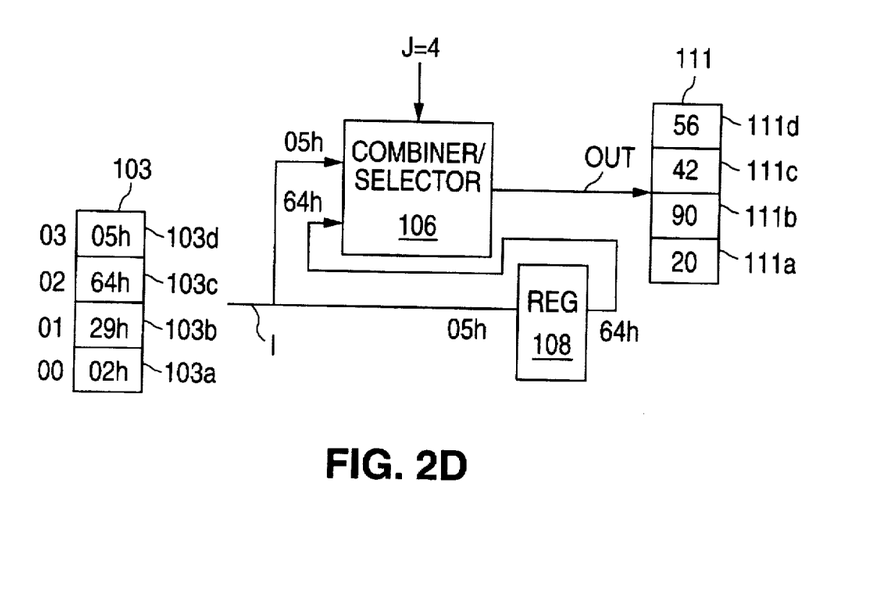

Finally, referring to FIG. 2D, during the fourth and final system clock cycle of the left shift operation, the least significant sub-word three times removed (05h) is provided onto the I-bus from the source sub-register 103d. During the fourth system clock cycle of the left shift operation, the sub-word on the I-bus is both provided to the carry-in register 108 for latching and provided to the combiner/selector 106 for shifting.

Meanwhile, the sub-word previously latched into the carry-in register (64h) is also provided to the combiner/selector 106. The combiner/selector 106 provides the shifted sub-word (i.e., the result sub-word) onto the OUT bus. Again, the least significant four bits of the sub-word on the I-bus (5h) are provided by the combiner/selector 106 as the most significant four bits of the result sub-word. The most significant four bits provided from the carry-in register 108 (6h) are provided by the combiner/selector 106 as the least significant four bits of the result sub-word.

Referring again to FIG. 2D, the result sub-word provided by the combiner/selector 106 in the fourth clock cycle of the shift operation is 56h—the 5h is the least significant four bits of the sub-word on the I-bus and the 6h is the most significant four bits of the sub-word provided from the carry-in register 108. The result sub-word provided by the combiner/selector 106 in the fourth system clock cycle of the shift operation is stored into result sub-register 111d.

Figure 3:
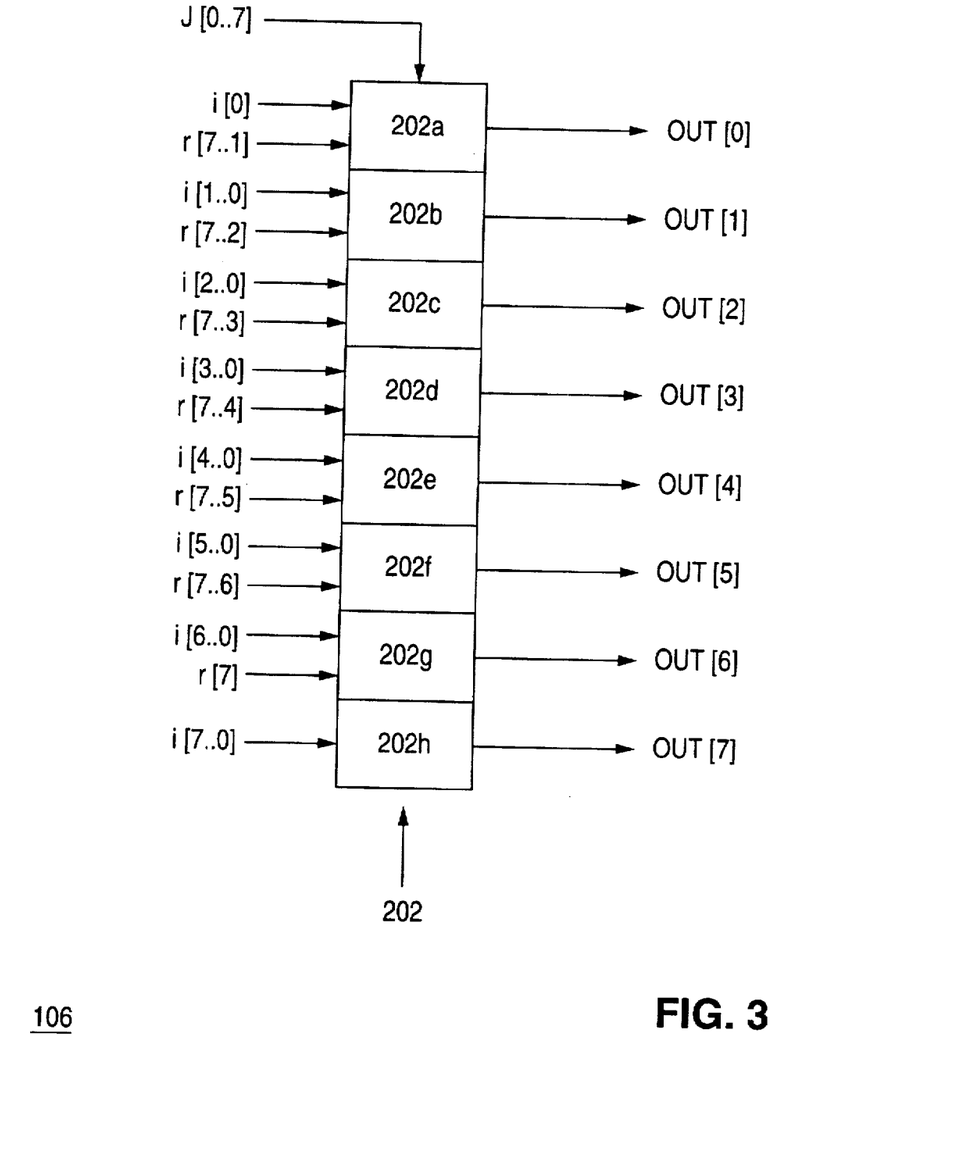
FIG. 3 schematically illustrates a detailed embodiment 202 of the combiner/selector 106 of FIG. 1, for performing left shifts.

Referring now to FIG. 3, this figure schematically illustrates a detailed embodiment 202 of the combiner/selector 106 of FIG. 1, for performing left shifts. In particular, the circuit 202 includes a shift cell 202a through 202h corresponding to each bit of a result sub-word output by the combiner/selector 106 during a single system clock cycle. That is, the shift cell 202a is for providing the least significant bit of the result sub-words. Table 1 shows which bit either from the I-bus or from the carry-in register 108 is to be provided for each bit of the result sub-word (onto the OUT-bus) for each particular value of J (the number of bits to shift left).

TABLE 1

| j assrtd. | out [7] | out [6] | out [5] | out [4] | out [3] | out [2] | out [1] | out [0] |
|---|---|---|---|---|---|---|---|---|
| j[0] | i[7] | i[6] | i[5] | i[4] | i[3] | i[2] | i[1] | i[0] |
| j[1] | i[6] | i[5] | i[4] | i[3] | i[2] | i[1] | i[0] | r[7] |
| j[2] | i[5] | i[4] | i[3] | i[2] | i[1] | i[0] | r[7] | r[6] |
| j[3] | i[4] | i[3] | i[2] | i[1] | i[0] | r[7] | r[6] | r[5] |
| j[4] | i[3] | i[2] | i[1] | i[0] | r[7] | r[6] | r[5] | r[4] |
| j[5] | i[2] | i[1] | i[0] | r[7] | r[6] | r[5] | r[4] | r[3] |
| j[6] | i[1] | i[0] | r[7] | r[6] | r[5] | r[4] | r[3] | r[2] |
| j[7] | i[0] | r[7] | r[6] | r[5] | r[4] | r[3] | r[2] | r[1] |

Thus, for OUT[0], which is the least significant bit of each result sub-word, the bit has the value of I[0], R[7], R[6], . . . , R[1], respectively for J having values of 0 through 7, respectively. This can be seen from the furthest right column of Table 1. Thus, shift cell 202a has as inputs I[0], R[7], R[6], . . . , R[1], since these are the only possible outputs of shift cell 202a. In addition, the J lines are provided to the shift cell 202a and the shift cell 202a provides to OUT[0] the input value indicated by the input J lines.

Likewise, for OUT[1], which is the next to least significant bit of each result sub-word, the bit has the value of I[1], I[0], R[7], . . . , R[2], respectively for J having values of 0 through 7, respectively. This can be seen from the next to further right hand column of Table 1. Thus, shift cell 202b has as inputs I[1], I[0], R[7], . . . , R[2], since these are the only possible outputs of shift cell 202b. It can be seen with reference to Table 1 that the outputs to the remaining shift cells 202c through 202h are similarly limited and these possible outputs determine the inputs of the remaining shift cells 202b through 202h. Each of shift cells 202b through 202h provide to its output OUT[2] through OUT[7], respectively, the input value indicated by the input J lines.

Figure 4:
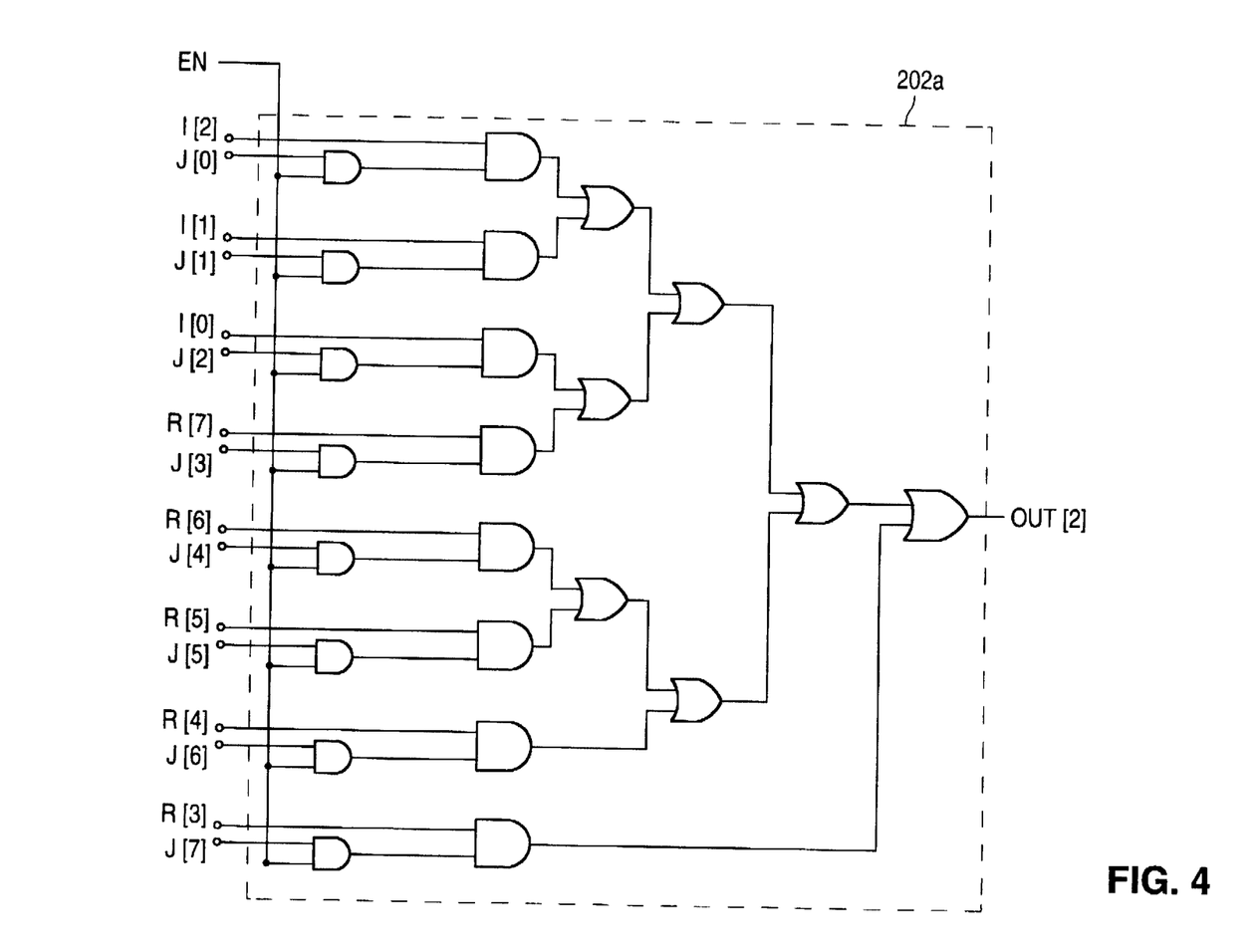
FIG. 4 schematically illustrates a detailed embodiment of the shift cell 202c of the combiner/selector circuit 202 of FIG. 3.

FIG. 4 schematically illustrates a detailed embodiment of the shift cell 202c, of the combiner/selector circuit 202, of FIG. 3. The detailed embodiment of the shift cell 202c shown in FIG. 4 consists of a network of AND devices and XOR devices that provides, when an ENABLE signal is asserted, a value for OUT[2] matching the input value that corresponds to the one asserted J line. The other shift cells 202a, 202b and 202d through 202h may be similarly embodied.

Figure 5:
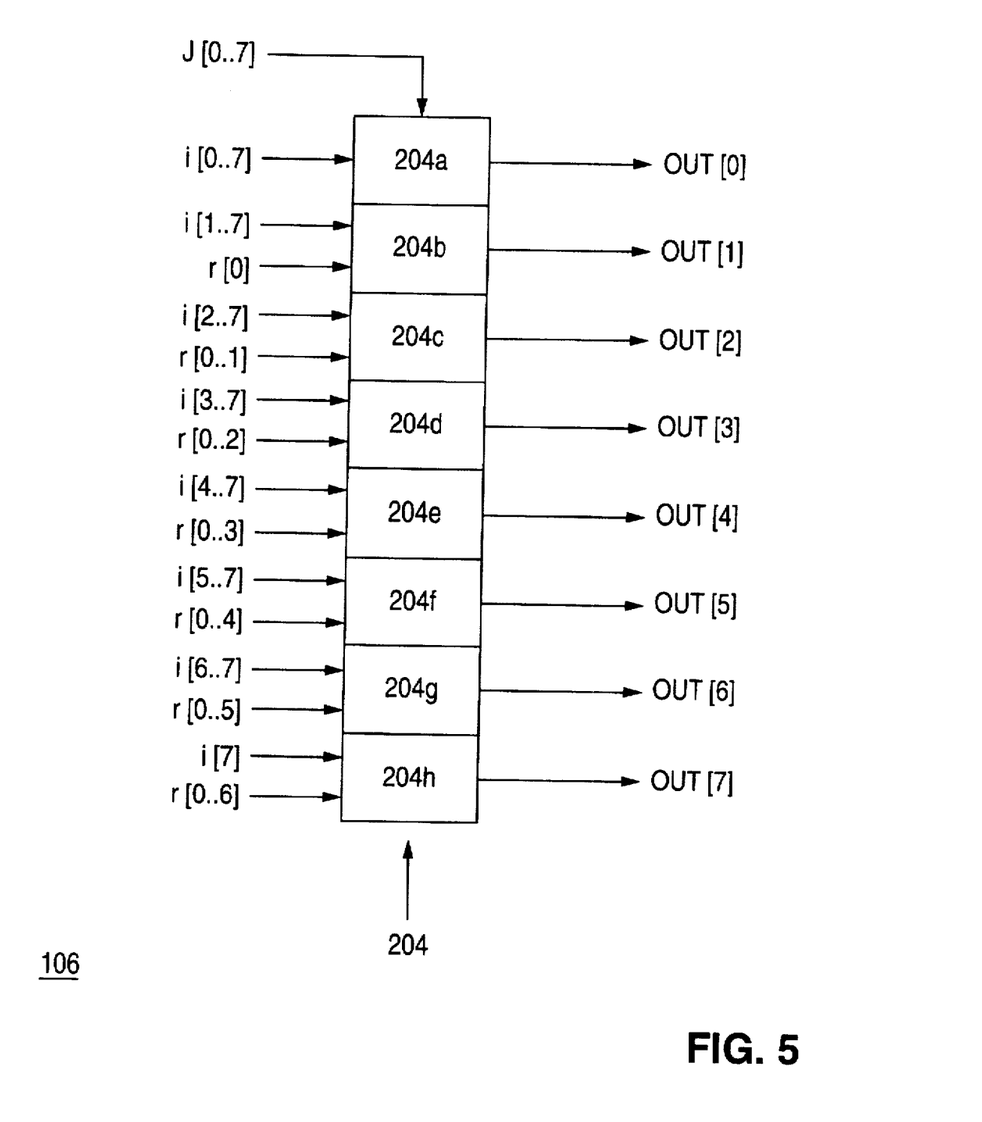
FIG. 5 schematically illustrates a detailed embodiment 204 of the combiner/selector 106 of FIG. 1, for performing right shifts.

Referring now to FIG. 5, this figure schematically illustrates a detailed embodiment 204 of the combiner/selector 106 of FIG. 1, for performing right shifts. In particular, the circuit 204 includes a shift cell 204a through 204h corresponding to each bit of a result sub-word output by the combiner/selector 106 during a single system clock cycle. That is, the shift cell 204a is for providing the least significant bit of the result sub-words. Table 2 shows which bit either from the I-bus or from the carry-in register 108 is to be provided for each bit of the result sub-word (onto the OUT-bus) for each particular value of J (the number of bits to shift right).

TABLE 2

| j assrtd. | out [7] | out [6] | out [5] | out [4] | out [3] | out [2] | out [1] | out [0] |
|---|---|---|---|---|---|---|---|---|
| j[0] | i[7] | i[6] | i[5] | i[4] | i[3] | i[2] | i[1] | i[0] |
| j[1] | r[0] | i[7] | i[6] | i[5] | i[4] | i[3] | i[2] | i[1] |
| j[2] | r[1] | r[0] | i[7] | i[6] | i[5] | i[4] | i[3] | i[2] |
| j[3] | r[2] | r[1] | r[0] | i[7] | i[6] | i[5] | i[4] | i[3] |
| j[4] | r[3] | r[2] | r[1] | r[0] | i[7] | i[6] | i[5] | i[4] |
| j[5] | r[4] | r[3] | r[2] | r[1] | r[0] | i[7] | i[6] | i[5] |
| j[6] | r[5] | r[4] | r[3] | r[2] | r[1] | r[0] | i[7] | i[6] |
| j[7] | r[6] | r[5] | r[4] | r[3] | r[2] | r[1] | r[0] | i[7] |

Figure 6:
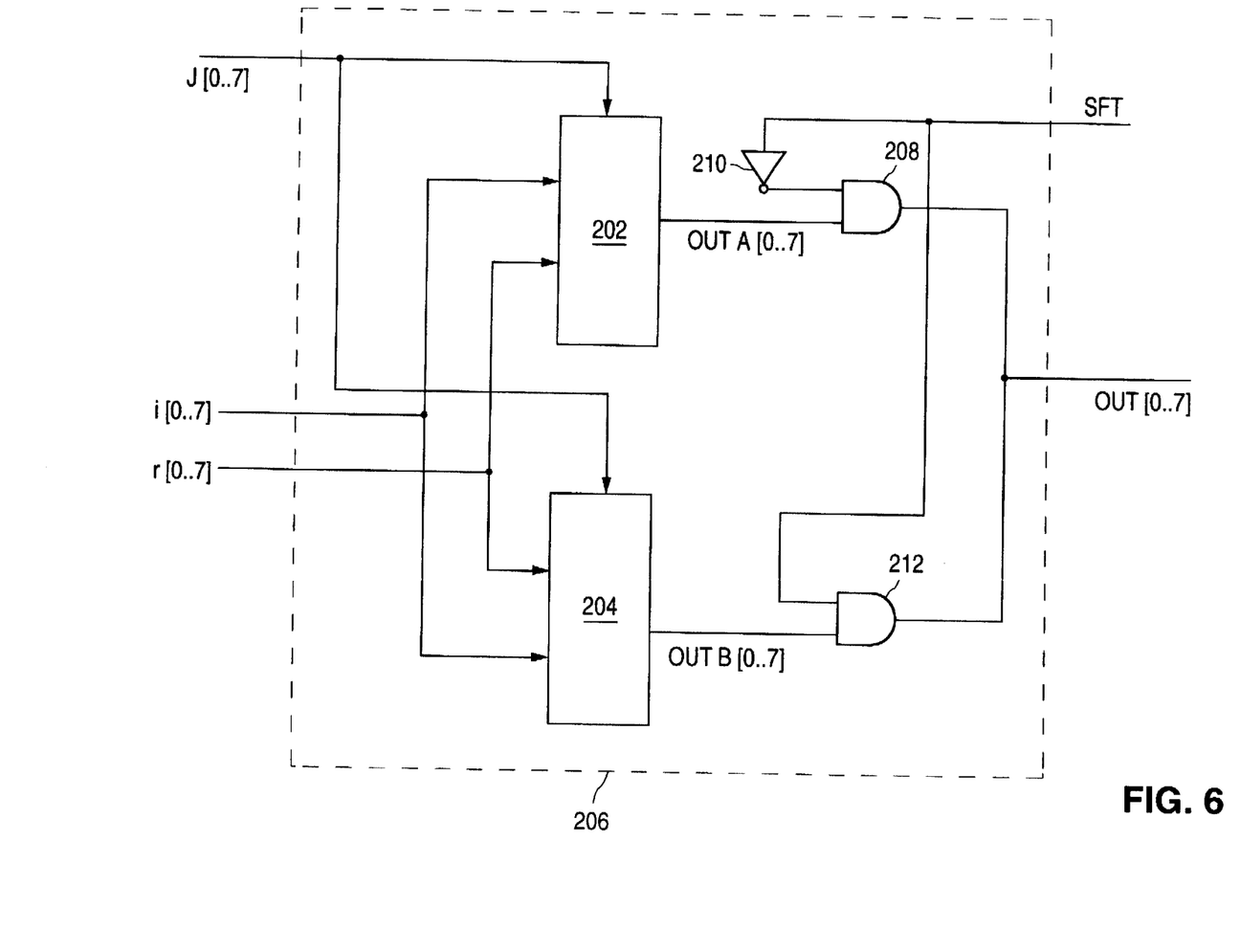
FIG. 6 schematically illustrates a detailed embodiment 206 of the combiner/selector 106 of FIG. 1, for selectively performing either left shifts or right shifts using the circuit 202 shown in FIG. 4 and the circuit 204 shown in FIG. 5.

FIG. 6 schematically illustrates a detailed embodiment 206 of the combiner/selector 106 of FIG. 1, for selectively performing either left shifts or right shifts using the circuit 202 shown in FIG. 4 and the circuit 204 shown in FIG. 5. A signal SFT, via inverter 210 and AND devices 208 and 212, determines which of the output OUTA[0 . . . 7] of the circuit 202 and the output OUTB[0 . . . 7] of the circuit 204 is provided as the result sub-word OUT[0 . . . 7].

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A shifting circuit operating on a plurality of input sub-words that collectively constitute an input data word to generate a plurality of result sub-words that collectively represent the input data word, shifted, the shifting circuit performing the operation in a plurality of cycles, comprising:

receiving circuitry that receives, during each cycle, a separate one of the plurality of input sub-words;

a carry-in register that, during said each cycle, latches the one input sub-word received during that cycle while providing the one input sub-word latched by the carry-in register during an immediately previous cycle;

combining circuitry that, during said each cycle, provides a result sub-word for that cycle responsive to both the one sub-word received by the receiving circuitry during that cycle and the one input sub-word provided by the carry-in register during that cycle.

2. The shifting circuit of claim 1, wherein:

the combining circuitry includes means for receiving a shift indication signal that indicates a number of bits (j) by which the input data word is to be shifted; and during said each cycle, the combining circuitry provides the result sub-word for that cycle including j bits of the one input sub-word latched by the carry-in register during the previous cycle and not including j bits of the one input sub-word received by the receiving circuitry during that cycle.

3. The shifting circuit of claim 2, wherein the combining circuitry includes a shift cell circuit for each bit of the result sub-words, each shift cell circuit including shift cell receiving circuitry for receiving, during said each cycle, a plurality of bits constituted of a selected subset of bits of the one sub-word received by the receiving circuitry during that cycle and the one input sub-word provided by the carry-in register during that cycle; and selection circuitry that provides one of the plurality of bits received by the shift cell receiving circuitry in response to the shift indication signal, the bits provided by the selection circuitry of all the shift cell circuits in said each cycle collectively constituting the result sub-word provided by the combining circuitry for that cycle.

4. The shifting circuit of claim 3, wherein the selected subset of bits of the one sub-word received by the receiving circuitry during that cycle and the one input sub-word provided by the carry-in register during that cycle, of which the plurality of bits received by each shift cell receiving circuitry is comprised, includes only those bits necessary for the shifting circuit to accomplish a first direction shift of the input data word.

5. The shifting circuit of claim 4, wherein the first direction is left.

6. The shifting circuit of claim 4, wherein the first direction is right.

7. The shifting circuit of claim 4, wherein the shift cell circuits are first shift cell circuits and the selected subset of bits of the one sub-word received by the receiving circuitry during that cycle and the one input sub-word provided by the carry-in register during that cycle, of which the plurality of bits received by the shift cell receiving circuitry of the first shift cells is comprised, includes only those bits necessary for the shifting circuit to accomplish a left shift of the input data word, and the combining circuitry comprising:

a second shift cell circuit for each bit of the result sub-words, the second shift cell circuits being substantially identical to the first shift cell circuits except that the selected subset of bits of the one sub-word received by the receiving circuitry during that cycle and the one input sub-word provided by the carry-in register during that cycle, of which the pluralty of bits received by the shift cell receiving circuitry of the second shift cells is comprised, includes only those bits necessary for the shifting circuit to accomplish a second direction shift of the input data word, where the second direction is opposite the first direction; and direction selection circuitry that receives a direction indication signal and that provides, as the result sub-words and in response to the direction indication signal, one of the result sub-words of the left shifted input data word and the result sub-words of the right shifted input data word.

* * * * *

UNITED STATES PATENT AND TRADEMARK OFFICE
CERTIFICATE OF CORRECTION

PATENT NO. : 5,761,266
DATED : June 2, 1998
INVENTOR(S) : CHARLES E. WATTS, JR.

It is certified that error appears in the above-indentified patent and that said Letters Patent is hereby corrected as shown below:

```
Column 6, line 54, "pluralty" should read --plurality--.
Column 7, line 10, "pluralty" should read --plurality--.
```

Signed and Sealed this

Twenty-fifth Day of August, 1998

Attest:

BRUCE LEHMAN

Attesting Officer

Commissioner of Patents and Trademarks